United States Patent
Wu et al.

(10) Patent No.: US 7,420,252 B2
(45) Date of Patent: Sep. 2, 2008

(54) LDMOS DEVICE WITH IMPROVED ESD PERFORMANCE

(75) Inventors: Kuo-Ming Wu, Hsinchu (TW); Jian-Hsing Lee, Hsin-Chu (TW); Yi-Chun Lin, Hsinchu (TW); Chi-Chih Chen, Dounan Township, Yunlin County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 241 days.

(21) Appl. No.: 11/337,147

(22) Filed: Jan. 20, 2006

(65) Prior Publication Data

US 2007/0170469 A1 Jul. 26, 2007

(51) Int. Cl.
*H01L 23/62* (2006.01)
(52) U.S. Cl. .................. 257/356; 257/355; 257/401; 257/328
(58) Field of Classification Search .......... 257/213, 257/360, 148, 335, 336
See application file for complete search history.

(56) References Cited

U.S. PATENT DOCUMENTS 6,664,140 B2 * 12/2003 Lee et al. ............... 438/129
2004/0262680 A1 * 12/2004 Ehwald et al. ........... 257/335
2006/0071236 A1 * 4/2006 Jensen et al. ............ 257/133

* cited by examiner

*Primary Examiner*—Wael Fahmy
*Assistant Examiner*—Telly D Green
(74) *Attorney, Agent, or Firm*—K & L Gates LLP

(57) ABSTRACT

A semiconductor device includes a first doped region disposed on a first well in a semiconductor substrate; a second doped region disposed on a second well adjacent to the first well in the semiconductor substrate, the second doped region having a dopant density higher than that of the second well; and a gate structure overlying parts of the first and second wells for controlling a current flowing between the first and second doped regions. A first spacing distance from an interface between the second doped region and the second well to its closest edge of the gate structure is greater than 200 percent of a second spacing distance from a center point of second doped region to the edge of the gate structure, thereby increasing impedance against an electrostatic discharge (ESD) current flowing between the first and second doped regions during an ESD event.

18 Claims, 4 Drawing Sheets

LDMOS DEVICE WITH IMPROVED ESD PERFORMANCE

BACKGROUND

The present invention relates generally to an integrated circuit (IC) design, and more particularly to a laterally diffused metal-oxide-semiconductor (LDMOS) device with improved electrostatic discharge (ESD) performance.

As semiconductor devices continue to shrink in size, their susceptibility to ESD damage becomes an increasingly important reliability concern. An ESD event occurs when electrostatic charge is transferred between one or more pins of an IC and another object in a short period of time. The rapid charge transfer often generates voltages large enough to break down insulating films of semiconductor devices, thereby causing permanent damages. In order to protect the semiconductor devices from ESD damages, various protection circuits can be implemented at the input and output pins of the IC to shunt ESD currents away from sensitive internal structures.

The LDMOS transistor is one kind of the semiconductor devices that are particularly susceptible to damages caused by the ESD event. The LDMOS device, featured by its extended source or drain doped region, is often found in circuits operating in high voltages, such as 5, 12, 40, 100 and 1000 volts. Conventionally, the LDMOS transistor requires some additional devices or circuit modules to protect it from ESD damages. These ESD protection devices and circuit modules typically require a separate set of fabrication process steps different from those for the LDMOS transistors. Thus, the addition of these ESD protection devices and circuit modules increases the costs of manufacturing ICs that have LDMOS transistors implemented thereon.

As such, it is desirable to have a LDMOS transistor with improved ESD protection performance, thereby eliminating the need for other additional ESD protection devices and circuit modules.

SUMMARY

The present invention discloses a semiconductor device with improved ESD protection performance. In one embodiment of the invention, the semiconductor device includes a first doped region disposed on a first well in a semiconductor substrate; a second doped region disposed on a second well adjacent to the first well in the semiconductor substrate, the second doped region having a dopant density higher than that of the second well; and a gate structure overlying parts of the first and second wells for controlling a current flowing between the first and second doped regions. A first spacing distance from an interface between the second doped region and the second well to its closest edge of the gate structure is greater than 200 percent of a second spacing distance from a center point of second doped region to the edge of the gate structure, thereby increasing impedance against an electrostatic discharge (ESD) current flowing between the first and second doped regions during an ESD event.

The construction and method of operation of the invention, however, together with additional objectives and advantages thereof will be best understood from the following description of specific embodiments when read in connection with the accompanying drawings.

DESCRIPTION

Figure 1A:
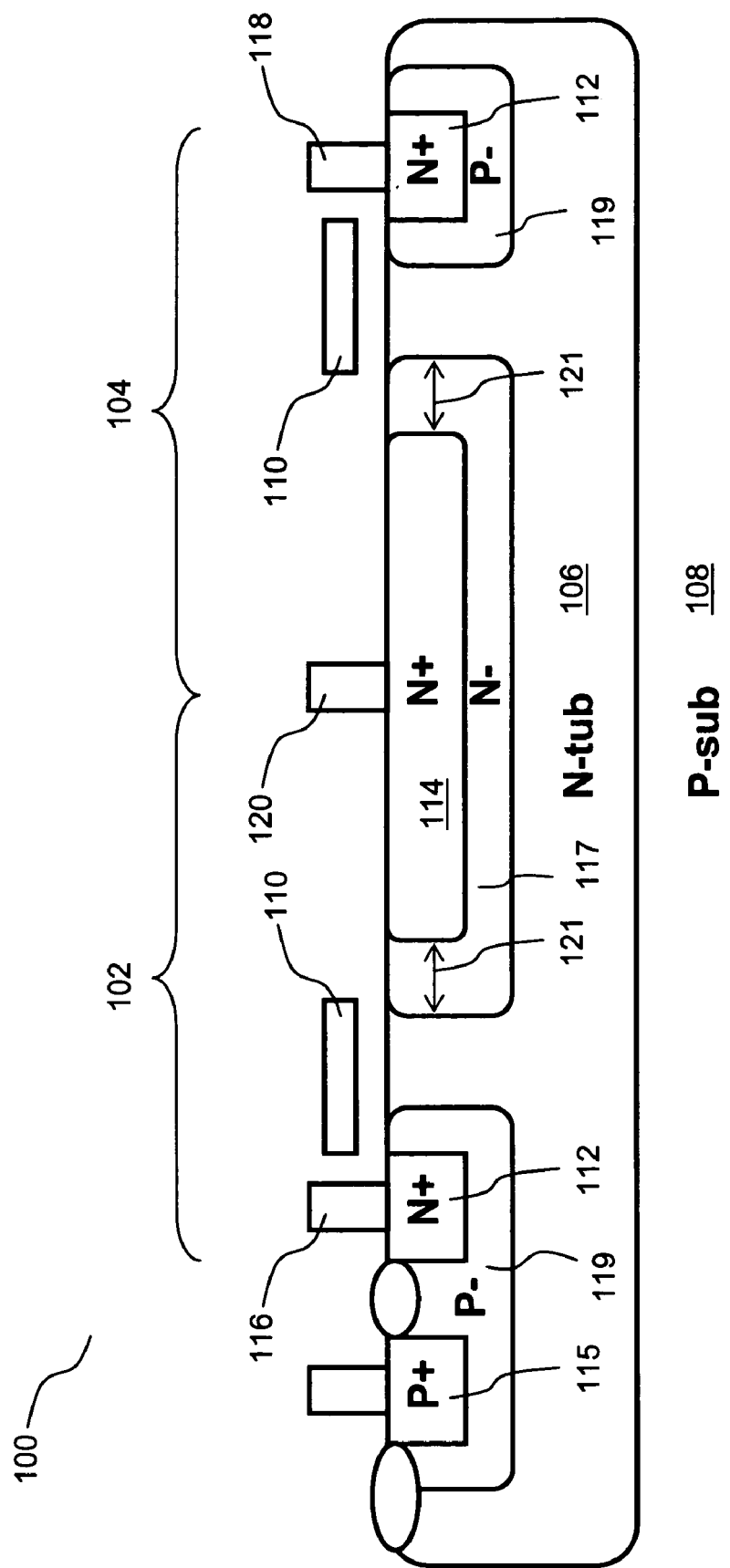
FIG. 1A illustrates a cross-sectional diagram of a conventional LDMOS device set.

FIG. 1A illustrates a cross-sectional diagram 100 of a conventional LDMOS device set, which includes two transistors 102 and 104. The transistors 102 and 104 can be used as ESD protection devices or normally functioned devices. Both the transistors 102 and 104 are implanted on an N-tub 106 above a P-type substrate 108. Each of the transistors 102 and 104 includes a gate structure 110, an N+ doped source region 112, and a shared N+ doped drain region 114.

The N+ doped source regions 112 for both the transistors 102 and 104 are formed on P-type wells 119. A P+ doped region 115 is also formed on one of the P-type wells 119 to provide a substrate contact. The N+ doped drain region 114 is formed on an N-type well 117 having a dopant density lower than that of the region 114. The gate structures 110 for both transistors 102 and 104 are formed on the surface that overlies parts of the P-type wells 119, the N-tub 106 and the N-type well 117. A set of source contacts 116 and 118 are implemented respectively at the N+ doped source regions of the transistors 102 and 104, while a drain contact 120 is implemented at the N+ doped drain region 114.

Figure 1B:
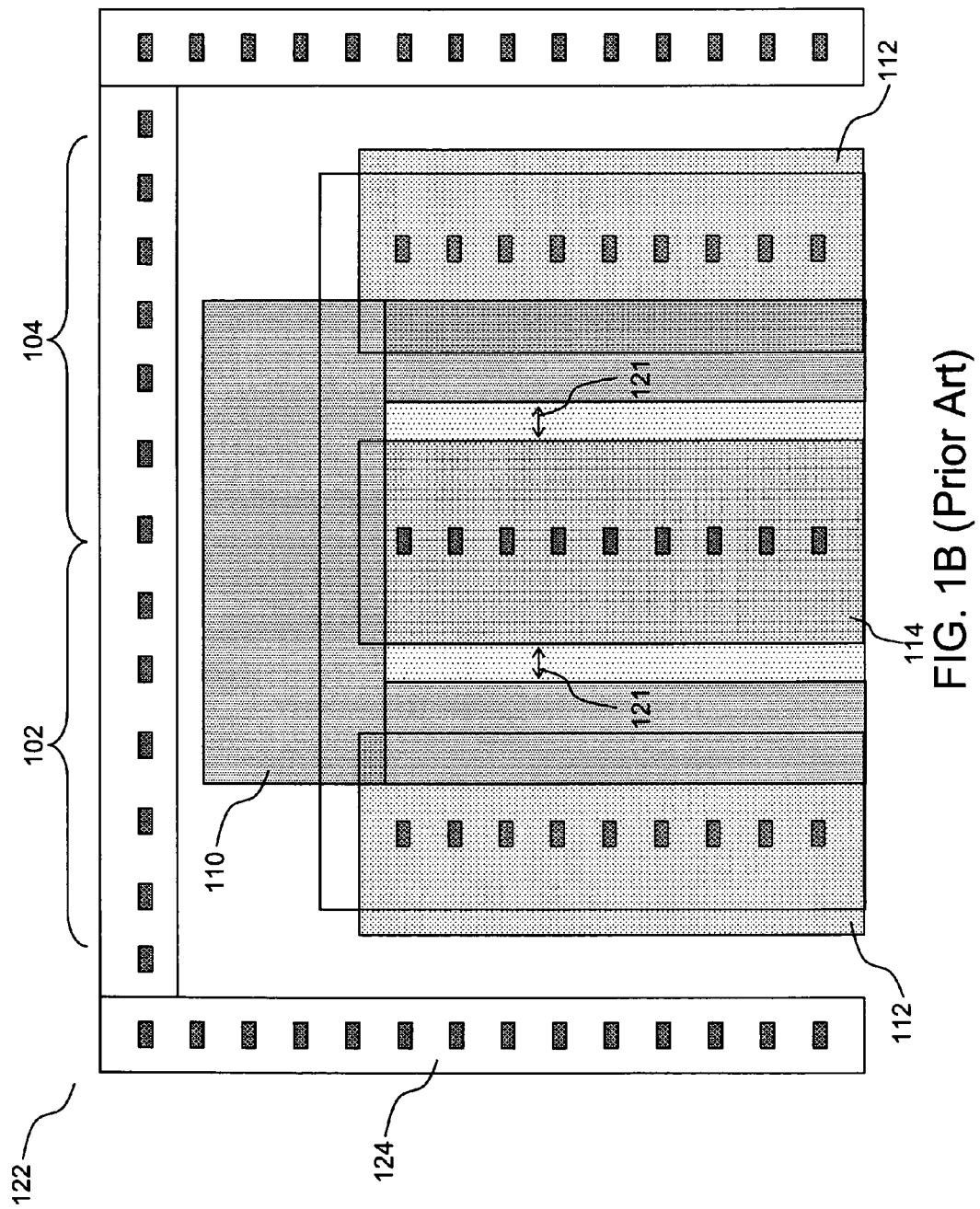
FIG. 1B illustrates a layout diagram of the conventional LDMOS device set shown in FIG. 1A.

FIG. 1B illustrates a layout diagram 122 of the conventional LDMOS device set shown in FIG. 1A. The layout diagram 122 shows the two LDMOS transistors 102 and 104 constructed by the gate structures 110, the N+ doped source regions 112, and the shared N+ doped drain region 114, within a P+ guard ring 124. The layout diagram 122 further illustrates the small spacing distances 121 between the N+ doped drain region 114 and the gate structures 110, which are critical for the transistors 102 and 104 to withstand ESD currents.

Referring simultaneously to both FIGS. 1A and 1B, the spacing distances 121 are not long enough to provide sufficient impedance against an electrical current flowing between the N+ doped drain region 114 and the N+ doped source regions 112 when the transistors 102 and 104 are at the off state. During an ESD event occurring at the contact 120, there is a high possibility that the ESD current would break down the transistors 102 and 104 and flow from the N+ doped drain region 114 to the N+ doped source regions 112. As a result, the LDMOS transistors 102 and 104 are very susceptible to ESD damages. Additional ESD protection devices or circuit modules may be needed to protect the transistors 102 and 104, thereby increasing manufacturing costs.

Figure 2A:
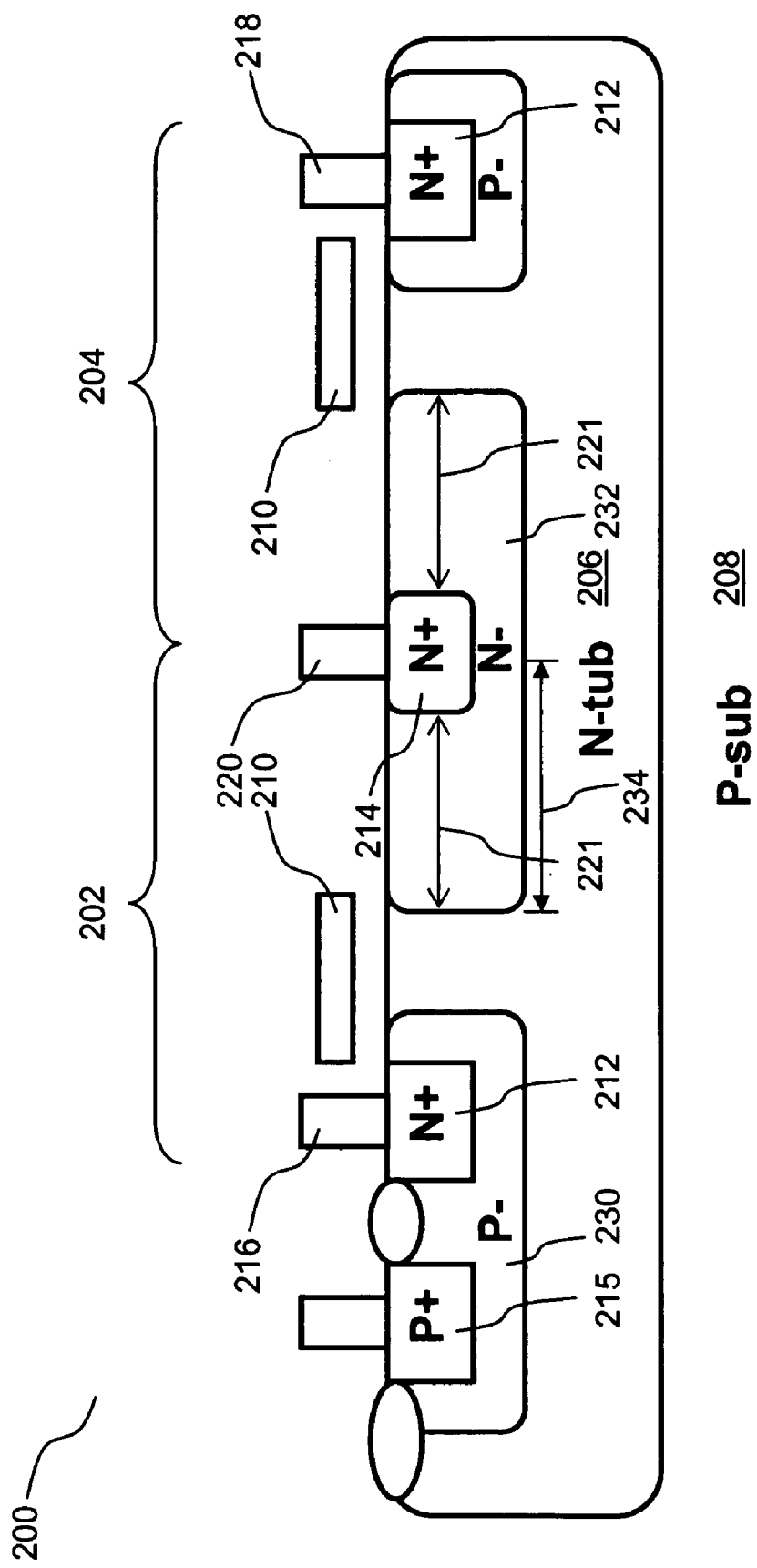
FIG. 2A illustrates a cross-sectional diagram of a LDMOS device set in accordance with one embodiment of the present invention.

FIG. 2A illustrates a cross-sectional diagram 200 of a LDMOS device set in accordance with one embodiment of the present invention. The LDMOS device includes two transistors 202 and 204, which are implanted on an N-tub 206 above a P-type substrate 208. Each of the transistors 202 and 204 includes a gate structure 210, an N+ doped source region 212, and a shared N+ doped drain region 214. The gate structure 210 can be constructed by a dielectric layer such as silicon oxide or nitride, and a conductive layer such as polysilicon or other metal materials. The P-type substrate 208 can be made of, for example, silicon, germanium, silicon-germanium alloys, or silicon on insulation (SOI) structures.

The N+ doped source regions 212 for both the transistors 202 and 204 are formed on P-type wells 230. A P+ doped region 215 is also formed on one of the P-type wells 230 to provide a substrate contact. The N+ doped drain region 214 is formed on an N-type well 232 having a dopant density lower than that of the region 214. In this embodiment, the dopant density of the N+ doped drain region 214 ranges approximately from $1\times10^{14}$ ($1/cm^2$) to $1\times10^{17}$ ($1/cm^2$), while the dopant density of the N-type well 232 ranges approximately from $1\times10^{11}$ ($1/cm^2$) to $1\times10^{14}$ ($1/cm^2$). The gate structures 210 for both transistors 202 and 204 are formed on the surface that overlies parts of the P-type wells 230, the N-tub 206 and the N-type well 232. A set of source contacts 216 and 218 are implemented respectively at the N+ doped source regions 212 of the transistors 202 and 204, while a drain contact 220 is implemented at the N+ doped drain region 214.

Figure 2B:
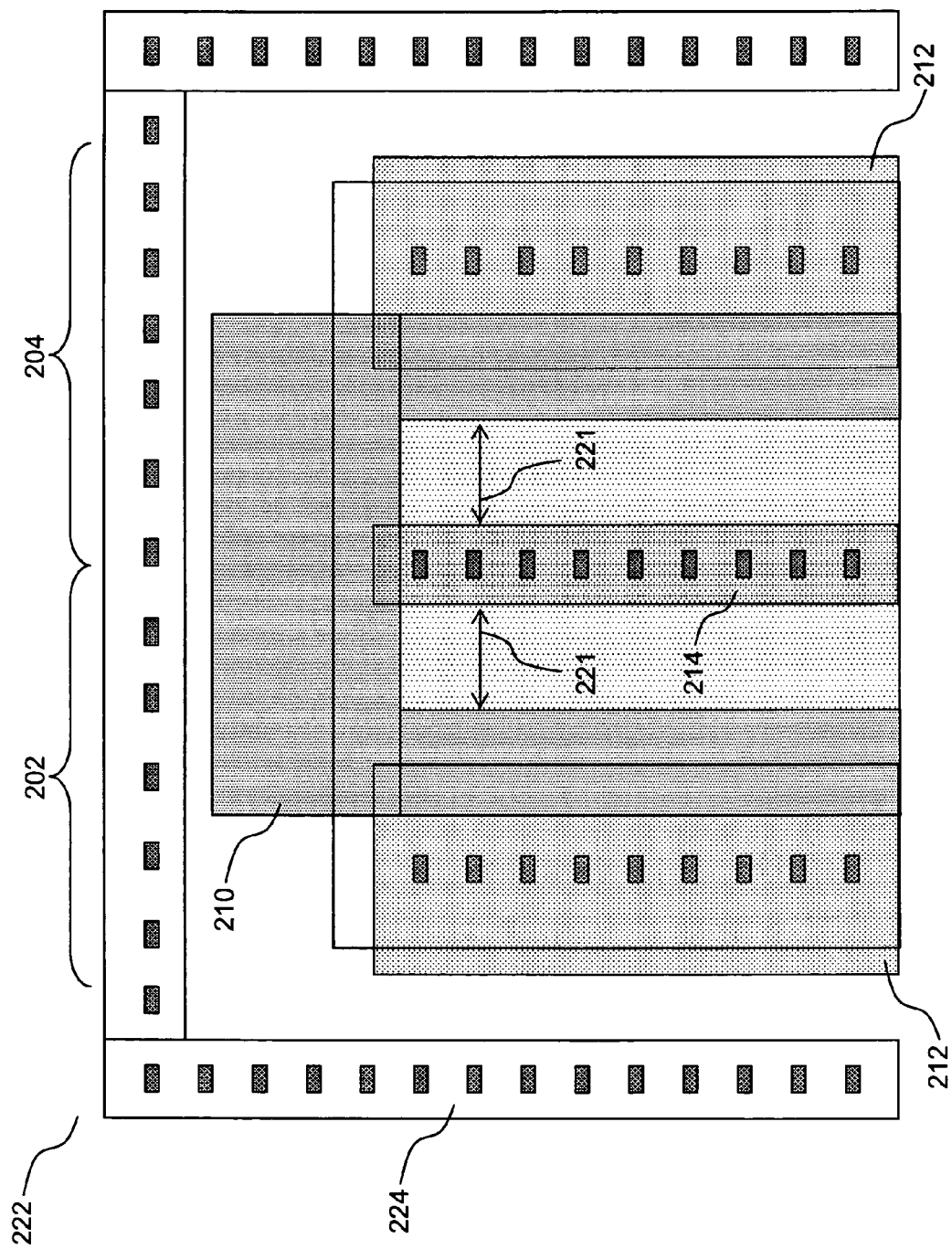
FIG. 2B illustrates a layout diagram of the LDMOS device set shown in FIG. 2A in accordance with one embodiment of the present invention.

FIG. 2B illustrates a layout diagram 222 of the LDMOS device set shown in FIG. 2A in accordance with the embodiment of the present invention. The layout diagram 222 shows the two LDMOS transistors 202 and 204 constructed by the gate structures 210, the N+ doped source regions 212, and the shared N+ doped drain region 214, within a P+ guard ring 224. The layout diagram 222 further illustrates the small spacing distances 221 between the N+ doped drain region 214 and the gate structures 210, which are critical for the transistors 202 and 204 to withstand ESD currents.

Referring to FIGS. 2A and 2B simultaneously, unlike the conventional LDMOS device shown in FIG. 1A, the N+ doped drain region 214 is designed to be much smaller in physical size, thereby allowing the spacing distances 221 between the gate structures 210 and the N+ implanted drain 214 to be increased. This, in turn, increases the impedance between the N+ doped drain region 214 and the N+ doped source regions 212. When an ESD event occurs at the contact 220, it would be more difficult for the ESD current to pass from the N+ doped drain region 214 to the N+ doped source region 212. Thus, the transistors 202 and 204 can withstand ESD better than their conventional counterparts. As such, the need for ESD protection devices or circuit modules that are particularly designed for the LDMOS device can be eliminated, thereby significantly reducing the manufacturing costs.

The determination of the value of spacing distance 221 is a matter of optimization, depending on, for example, the device dimensions. As a general rule the spacing distance 221 measured from an interface between the N+ doped drain region 214 and the N-type well 232 to its closest edge of the gate structure 210 should be greater than 200 percent of a reference spacing distance 234 from a center point of N+ doped drain region 214 to the edge of the gate structure. In a specific embodiment, the spacing distance 221 should be greater than 1.5 μm. The LDMOS transistors 202 and 204 can be dedicated ESD protection devices as opposed to other normally functioned LDMOS transistors. The LDMOS transistors that function as ESD protection devices should have a longer spacing distance than that of the normally functioned LDMOS transistors.

While the above-mentioned embodiment uses N-type LDMOS transistors for descriptive purposes, it is understood by those skilled in the art that they can also be P-type LDMOS transistors. Specifically, the doped regions 212 and 214, and the well 232 should be doped with the same type of dopant, while the well 230 should be doped with a different type of dopant. It is noted that silicide layers interfacing the contacts 216 and 220 and the doped regions 212 and 214 can be alternatively formed in another embodiment of the present invention.

Table I below provides a set of test data demonstrating how ESD performance of a LDMOS device can be improved by increasing the spacing between its doped drain region and gate structure.

TABLE I

| Device | PO—N+ | N+—CO | Total Width | IT | +HBM/Vss | +MM/Vss |
|---|---|---|---|---|---|---|
| A | 0.4 μm | 0.25 μm | 360 μm | 0.2 A | 0.5 kV | Below 50 V |
| B | 1.0 μm | 0.25 μm | 360 μm | 0.6 A | 2.0 kV | 100 V |
| C | 1.5 μm | 0.25 μm | 360 μm | 5.1 A | 3.0 kV | 350 V |
| D | 2.0 μm | 0.25 μm | 360 μm | 5.2 A | 7.5 kV | 500 V |

Specifically, Table I shows specifications and test results of four different LDMOS devices: A, B, C, and D. All four LDMOS devices A, B, C, and D are designed to have a total width of 360 μm and a spacing of 0.25 μm between the edges of the drain region and the drain contact. The LDMOS device A is designed to the specifications of the conventional LDMOS device shown in FIG. 1A. More specifically, the LDMOS device A has a small spacing of 0.4 μm between the drain region and the gate structure. The LDMOS devices B, C, and D are designed to the specifications of the LDMOS device shown in FIG. 2A. More specifically, the LDMOS devices B, C, and D have corresponding spacing distances of 1.0, 1.5, and 2.0 μm between the drain region and the gate structures. From the results of the test, it can be shown that by setting the spacing between the gate structures and doped drain region higher, ESD performance of the LDMOS device can be improved.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device comprising:
   a first doped region disposed on a first well in a semiconductor substrate;
   a second doped region disposed on a second well adjacent to the first well in the semiconductor substrate, the second doped region having a dopant density higher than that of the second well;
   a first contact disposed on the first doped region, and a second contact disposed on the second doped region; and
   a gate structure overlying parts of the first and second wells for controlling a current flowing between the first and second doped regions,
   wherein a first spacing distance from an interface between the second doped region and the second well to its closest edge of the gate structure is greater than 200 percent of a second spacing distance between edges of the second doped region and the second contact, thereby increasing impedance against an electrostatic discharge (ESD) current flowing between the first and second doped regions during an ESD event.

2. The semiconductor device of claim 1, wherein the first spacing distance is greater than 1.5 μm.

3. The semiconductor device of claim 1, wherein the dopant density of the second doped region ranges approximately from $1\times10^{14}$ ($1/cm^2$) to $1\times10^{17}$ ($1/cm^2$).

4. The semiconductor device of claim 1, wherein the dopant density of the second well ranges approximately from $1\times10^{11}$ ($1/cm^2$) to $1\times10^{14}$ ($1/cm^2$).

5. The semiconductor device of claim 1, wherein the first doped region, the second doped region, and the second well are doped with a first type of dopant, and the first well is doped with a second type of dopant.

6. The semiconductor device of claim 1, further comprising a third well surrounding the first and second wells in the semiconductor substrate.

7. The semiconductor device of claim 1, further comprising a first contact disposed on the first doped region, and a second contact disposed on the second doped region.

8. A laterally diffused metal-oxide-semiconductor (LDMOS) transistor comprising:
   a first doped region disposed in a first well on a semiconductor substrate;
   a second doped region disposed on a second well adjacent to the first well in the semiconductor substrate, the second doped region having a dopant density higher than that of the second well;
   a first contact disposed on the first doped region, and a second contact disposed on the second doped region; and
   a gate structure overlying parts of the first and second wells for controlling a current flowing between the first and second doped regions,
   wherein a first spacing distance from an interface between the second doped region and the second well to its closest edge of the gate structure is greater than 200 percent of a second spacing distance between edges of the second doped region and the second contact for increasing impedance against an electrostatic discharge (ESD) current flowing between the first and second doped regions during an ESD event.

9. The LDMOS transistor of claim 8, wherein the dopant density of the second doped region ranges approximately from $1\times10^{14}$ ($1/cm^2$) to $1\times10^{17}$ ($1/cm^2$).

10. The LDMOS transistor of claim 8, wherein the dopant density of the second well ranges approximately from $1\times10^{11}$ ($1/cm^2$) to $1\times10^{14}$ ($1/cm^2$).

11. The LDMOS transistor of claim 8, wherein the first doped region, the second doped region, and the second well are doped with a first type of dopant, and the first well is doped with a second type of dopant.

12. The LDMOS transistor of claim 8, further comprising a third well surrounding the first and second wells in the semiconductor substrate.

13. The LDMOS transistor of claim 8, further comprising a first contact disposed on the first doped region, and a second contact disposed on the second doped region.

14. An integrated circuit comprising:
   a first laterally diffused metal-oxide-semiconductor (LDMOS) transistor comprising:
      a first doped region disposed on a first well in a semiconductor substrate;
      a second doped region disposed on a second well adjacent to the first well in the semiconductor substrate, the second doped region having a dopant density higher than that of the second well;
      a first gate structure overlying parts of the first and second wells for controlling a current flowing between the first and second doped regions;
   a second LDMOS transistor comprising:
      a third doped region disposed on a third well in the semiconductor substrate;
      a fourth doped region disposed on a fourth well adjacent to the third well in the semiconductor substrate, the fourth doped region having a dopant density higher than that of the fourth well;
      a first contact disposed on the first doped region, and a second contact disposed on the second doped region; and
      a second gate structure overlying parts of the third and fourth wells for controlling a current flowing between the third and fourth doped regions,
   wherein a first closest distance between the first gate structure and the second doped region is greater than 200 percent of a second spacing distance between edges of the second doped region and the second contact, thereby increasing impedance against an electrostatic discharge (ESD) current flowing between the first and second doped regions during an ESD event.

15. The integrated circuit of claim 14, wherein the first closest distance is greater than 1.5 μm.

16. The integrated circuit of claim 14, wherein the dopant density of the second doped region ranges approximately from $1\times10^{14}$ ($1/cm^2$) to $1\times10^{17}$ ($1/cm^2$).

17. The integrated circuit of claim 14, wherein the dopant density of the second well ranges approximately from $1\times10^{11}$ ($1/cm^2$) to $1\times10^{14}$ ($1/cm^2$).

18. The integrated circuit of claim 14, wherein the first doped region, the second doped region, and the second well are doped with a first type of dopant, and the first well is doped with a second type of dopant.

* * * * *